US012287982B2

(12) United States Patent
Rayaprolu et al.

(10) Patent No.: US 12,287,982 B2
(45) Date of Patent: Apr. 29, 2025

(54) HOST DATA STORAGE SCAN DATA RETENTION RATING

(71) Applicant: Micron Technology, Inc., Boise, ID (US)

(72) Inventors: Vamsi Pavan Rayaprolu, Santa Clara, CA (US); Thomas Lentz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 17/953,182

(22) Filed: Sep. 26, 2022

(65) Prior Publication Data

US 2024/0069785 A1 Feb. 29, 2024

Related U.S. Application Data

(60) Provisional application No. 63/402,575, filed on Aug. 31, 2022.

(51) Int. Cl.
*G06F 3/06* (2006.01)
(52) U.S. Cl.
CPC .......... *G06F 3/0653* (2013.01); *G06F 3/0604* (2013.01); *G06F 3/0644* (2013.01); *G06F 3/0679* (2013.01)

(58) Field of Classification Search
CPC .... G06F 3/0653; G06F 3/0604; G06F 3/0644; G06F 3/0679
USPC ....................................................... 711/154
See application file for complete search history.

(56) References Cited

U.S. PATENT DOCUMENTS 10,998,041 B1 * 5/2021 Avraham ............... G11C 16/26
2017/0068468 A1 * 3/2017 Rothberg .............. G06F 3/0688

* cited by examiner

*Primary Examiner* — Gautam Sain
(74) *Attorney, Agent, or Firm* — Lowenstein Sandler LLP

(57) ABSTRACT

A system includes a memory device containing multiple dies that each have multiple pages, and a processing device, operatively coupled with the memory device, to perform various operations including scanning a group of pages residing on a die and determining a value of one data state metric and a corresponding value of another state metric. The operations can also include recording a set of values of the first metric and a corresponding set of values of the second metric, as well as calculating the value of the second metric corresponding to a predetermined value of the first metric associated with a failure condition of the die. Additionally, the operations can include identifying a particular criterion that is satisfied by the calculated value, assigning, to the die, a rating corresponding to the identified criterion, and performing scans on the die at a frequency determined by the assigned rating.

20 Claims, 8 Drawing Sheets

HOST DATA STORAGE SCAN DATA RETENTION RATING

RELATED APPLICATIONS

This application claims the benefit of U.S. Provisional Patent Application No. 63/402,575, filed Aug. 31, 2022, entitled "HOST DATA STORAGE SCAN DATA RETENTION RATING," which is incorporated by reference herein.

TECHNICAL FIELD

Embodiments of the disclosure relate generally to memory sub-systems, and more specifically, relate to managing the rating of memory device components by assigning ratings to components based on measurements obtained from scans of host data.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
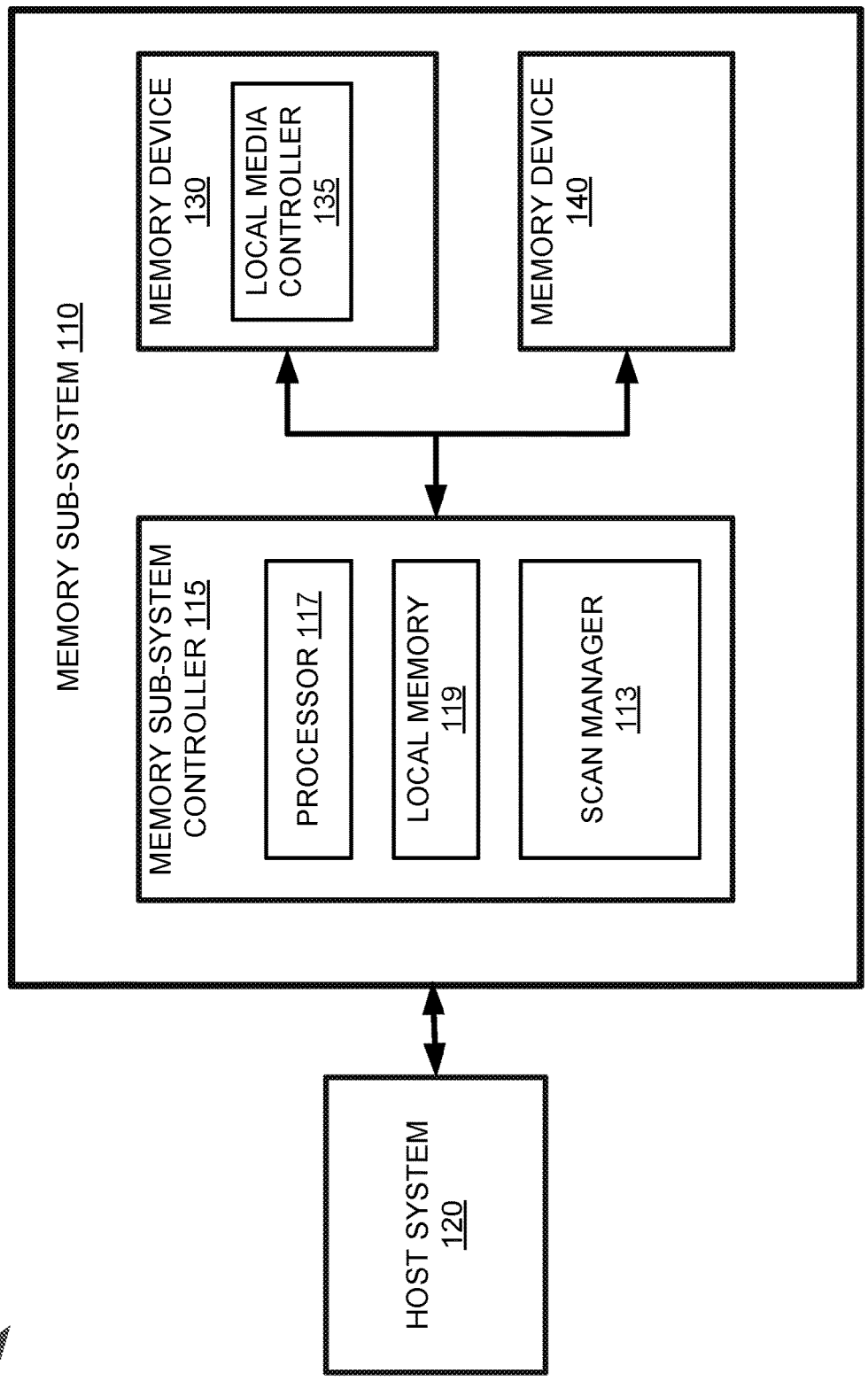
FIG. 1 illustrates an example computing system that includes a memory sub-system in accordance with some embodiments of the present disclosure.

Aspects of the present disclosure are directed to managing the rating of dies in memory devices. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane can consist of a set of physical blocks. In some embodiments, each block can include multiple sub-blocks. Each block can consist of a set of pages. Each page can consist of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include cells arranged in a two-dimensional or three-dimensional grid. Memory cells can be etched onto a silicon wafer in an array of columns connected by conductive lines (also hereinafter referred to as bitlines or BLs) and rows connected by conductive lines (also hereinafter referred to as wordlines or WLs). A wordline can refer to a conductive line that connects control gates of a set (e.g., one or more rows) of memory cells of a memory device that are used with one or more bitlines to generate the address of each of the memory cells. In some embodiments, each plane can carry an array of memory cells formed onto a silicon wafer and joined by conductive BLs and WLs, such that a wordline joins multiple memory cells forming a row of the array of memory cells, while a bitline joins multiple memory cells forming a column of the array of memory cells. The intersection of a bitline and wordline constitutes the address of the memory cell. A block hereinafter refers to a unit of the memory device used to store data and can include a group of memory cells, a wordline group, a wordline, or individual memory cells addressable by one or more wordlines. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A cell can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_t$ (also referred to as the "threshold voltage") such that the source-drain electric current is low for the control gate voltage ($V_{CG}$)

being below the threshold voltage, $V_{CG}<V_t$. The current increases substantially once the control gate voltage has exceeded the threshold voltage, $V_{CG}>V_t$. Because the actual geometry of the electrodes and gates varies from cell to cell, the threshold voltages can be different even for cells implemented on the same die. The cells can, therefore, be characterized by a distribution P of the threshold voltages, $P(Q, V_t)=dW/dV_t$, where dW represents the probability that any given cell has its threshold voltage within the interval $[V_t, V_t+dV_t]$ when charge Q is placed on the cell.

A programming operation can be performed by applying a series of incrementally increasing programming pulses that to the control gate of a memory cell being programmed. A program verify operation after each programming pulse can determine the threshold voltage of the memory cell resulting from the preceding programming pulse. When memory cells are programmed, the level of the programming achieved in a cell (e.g., the $V_t$ of the cell) is verified, in effect, by comparing the cell $V_t$ to a target (i.e., desired) program verify (PV) voltage level. The PV voltage level can be provided by an external reference.

A program verify operation involves applying a ramped voltage to the control gate of the memory cell being verified. When the applied voltage reaches the threshold voltage of the memory cell, the memory cell turns on and sense circuitry detects a current on a bit line coupled to the memory cell. The detected current activates the sense circuitry which can determine whether the present threshold voltage is greater than or equal to the target threshold voltage. If the present threshold voltage is greater than or equal to the target threshold voltage, further programming is not needed. Otherwise, programming continues in this manner with the application of additional program pulses to the memory cell until the target $V_t$ and data state is achieved.

Precisely controlling the amount of the electric charge stored by the cell allows multiple logical levels to be distinguished, thus effectively allowing a single memory cell to store multiple bits of information. One type of cell is a single level cell (SLC), which stores 1 bit per cell and defines 2 logical states ("states") ("1" or "L0" and "0" or "L1") each corresponding to a respective $V_t$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_t$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_t$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A memory cell can be read by applying a ramped voltage to the control gate of the memory cell. If the applied voltage is equal to or greater than the threshold voltage of the memory cell, the memory cell turns on and sense circuitry can detect a current on a bit line coupled to the memory cell. The detected current activates the sense circuitry determines the present threshold voltage of the cell. Accordingly, certain non-volatile memory devices can use a demarcation voltage (i.e., a read reference voltage) to read data stored at memory cells. For example, when a read reference voltage (also referred to herein as a "read voltage") is applied to the memory cells, if a $V_t$ of a specified memory cell is identified as being below the read reference voltage that is applied to the specified memory cell, then the data stored at the specified memory cell can be read as a particular value (e.g., a logical '1') or determined to be in a particular state (e.g., a set state). If the $V_t$ of the specified memory cell is identified as being above the read reference voltage, then the data stored at the specified memory cell can be read as another value (e.g., a logical '0') or determined to be in another state (e.g., a reset state). Thus, the read reference voltage can be applied to memory cells to determine values stored at the memory cells. Such threshold voltages can be within a range of threshold voltages or reflect a normal distribution of threshold voltages.

In some memory sub-systems, a read operation can be performed by comparing the measured threshold voltages ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory, one or more portions where the sub-blocks are configured as multi-level cell (MLC) memory that can store two bits of information per cell, (triple-level cell) TLC memory that can store three bits of information per cell, and/or one or more portions where the sub-blocks are configured as quad-level cell (QLC) memory that can store four bits per cell. The voltage levels of the memory cells in TLC memory form a set of 8 programming distributions representing the 8 different combinations of the three bits stored in each memory cell. Depending on how the memory cells are configured, each physical memory page in one of the sub-blocks can include multiple page types. For example, a physical memory page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical memory page formed from memory cells of the QLC memory type can have a total of four logical pages, where each logical page can store data distinct from the data stored in the other logical pages associated with that physical memory page, which is herein referred to as a "page."

A memory device can exhibit threshold voltage distributions $P(Q, V_t)$ that are narrow compared with the working range of control voltages tolerated by the cells of the device. Accordingly, multiple non-overlapping distributions $P(Q_k, V_t)$ can be fit into the working range allowing for storage and reliable detection of multiple values of the charge $Q_k$, k=1, 2, 3 . . . . The distributions can be interspersed with voltage ranges ("valleys") defined by voltage values ("valley margins") between which none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_t$ of the cell resides. This effectively allows a single memory cell to store multiple bits of information: a memory cell operated with 2N−1 well-defined valleys and 2N distributions is capable of reliably storing N bits of information. Specifically, the read operation can be performed by comparing the measured threshold voltage $V_t$ exhibited by the memory cell to one or more reference voltage levels corresponding to known valley centers of the memory device in order to distinguish between the multiple logical programming levels and determine the programming state of the cell.

A valley width can also be referred to as a read window (i.e., a size measured in volts, representing the distance, on a voltage scale, between a $V_t$ distribution associated with one programming level and a $V_t$ distribution associated with a subsequent programming level). Thus, a read window can define a range of demarcation voltage levels that can be used to accurately distinguish the one state of a cell from another state. For example, in a SLC cell, there is one read window that exists with respect to the two $V_t$ distributions. Analogously, in an MLC cell, there are three read windows that exist with respect to the four $V_t$ distributions. Similarly, in a TLC cell, there are seven read windows that exist with respect to the eight $V_t$ distributions. Read window size generally decreases as the number of states increases. For example, the one read window for the SLC cell may be larger than each of the three read windows for the MLC cell, and each of the three read windows for the MLC cell may be larger than each of the seven read windows for the TLC cell, etc. Read window budget (RWB) refers to the cumulative value of the read windows (i.e., the total size of all the read windows of a set of memory cells). For example, an aggregate sum of voltage ranges of all of the read windows between multiple $V_t$ distributions of a group of cells can be referred to as an RWB.

In certain memory devices, a $V_t$ of a particular memory cell or the $V_t$ distribution of multiple memory cells can shift or change over time (e.g., due to properties of a material or due to operations performed on the memory device). Consequently, the valley width between particular adjacent $V_t$ distributions can also change due to the distribution shifts.

For example, the $V_t$ of each memory cell in a group of memory cells storing a logical state of '1' or the $V_t$ of each memory cell in a group of memory cells storing a logical state of '0' can shift over time. Therefore, the respective $V_t$ distribution of cells programmed to a particular state can increase. Furthermore, the $V_t$ of the memory cells programmed to a particular state can often not be uniform across an array of memory cells in a memory device. The lack of uniformity can be due to some memory cells having been subject to more read/write operations than others leading to each $V_t$ distribution becoming wider. Accordingly, in these circumstances, the valley width between adjacent $V_t$ distributions can decrease. When the $V_t$ of a memory cell changes, the application of the read voltage can yield an incorrect result (i.e., an error) due to the changed $V_t$ (i.e., the data stored at the memory cell can be incorrectly interpreted when the $V_t$ of the memory cell shifts from below the read voltage to above the read voltage). Some approaches can correct these errors by accounting for these shifts. However, as the valleys between adjacent distributions shift and the widths of the valleys decrease, the RWB for a particular group of cells decreases as well and reduces the ability of a memory sub-system to correct errors.

In some cases, during the operating life of a memory device, a set state (e.g., a lower voltage level associated with a bit value of '1') and a reset state (e.g., a higher voltage level associated with a bit value of '0') for a memory cell can register higher than expected voltage levels with respect to the predefined $V_t$ read level. As such, a memory cell of a memory device that was programmed to a set state, could be interpreted by a read operation as a higher voltage level indicative of a reset state. This misinterpretation, in turn, can result in a higher error rate due to the above-mentioned $V_t$ shift that can impact the representative voltage state of the affected memory cells. Additionally, due to a decreased valley width between the $V_t$ distribution representative of the set state and the $V_t$ distribution representative of a reset state, the ability of the memory sub-system to correct these errors is often drastically reduced.

To monitor memory devices and adjust operating parameters, various scans can be performed on different areas of a memory device. Such scans can include measurements of various data state metrics such as the above-mentioned $V_t$ distribution shifts, valley shifts, and valley widths. The scans can also provide measurements of data state metrics such as a read count, an error count and a raw bit error rate (RBER), which refers to the error rate in terms of a count of bits when a data access operation is performed on a memory device.

Memory devices can be manufactured with certain imperfections and can develop defects in their components over time. For example, memory cells in a memory device can wear out over time as their ability to retain a charge and, consequently, to remain at a particular programming level (i.e., data) deteriorates with increased use. In some cases, an element of a memory device can be defined to have reached the extent of its data retention capability when its level of degradation causes a failure in memory device operation (e.g., when the memory device cannot reliably read data from the component). For example, a die of a memory device can be said to have reached the end of its data retention capability if its memory cells have degraded to such a point that the memory device cannot reliably read data from the memory cells on the die (i.e., when attempts to read data from the memory cells on the die result in a rate of errors that exceeds the ability of the device to correct them). Thus, in some cases, a failure condition of the die on the memory device can refer to a specific degree of data degradation at which a read operation performed on the data of the die generates an error rate exceeding the ability of the device to correct them. This degree of degradation (i.e., the failure condition at which data cannot be reliably read back) can be reflected by and can correspond to specific predetermined values of data state metrics (e.g., valley shift values, read counts, valley width values, error counts, RBER, RWB, etc.). These predetermined values (e.g., of valley shift or read count) that reflect a failure condition of a die on a memory device, can be known from statistics and historical data obtained from scans and testing of various memory devices.

Since the data retention capability of the parts of a memory device affects the longevity and the useful lifetime of the memory device, determining the data retention capability of a device is important for data storage management. The data retention capability of a part of a memory device can determine whether data is written on the part and how often the part should be scanned to check data integrity, to calibrate operations of the memory device, and to perform memory management operations. In some memory sub-systems, to accurately determine the data retention capability of the dies of memory devices, several approaches of inducing stress on the memory cells of the die can be used. These approaches include: (i) writing data and checking (i.e., reading) the data after allowing it to remain on the memory device for a specified amount of time; (ii) writing data and then reading it repeatedly for a specified time at a specific speed or frequency; and (iii) repeating cycles of writing and erasing data to the memory device. However, each of these approaches require blocks to be set aside so that they can be exclusively used for the stress inducing workloads. Moreover, these approaches require the creation and maintenance of additional cursors (i.e., pointers or indicators to physical locations on the memory device) by the memory sub-systems. Often, the commands operations that induce the stress can collide with commands received from the host system and increase latency. Furthermore, the allocation of blocks to be used exclusively for stress inducing operations reduces the amount of available space available on the memory device for data storage. Accordingly, these approaches are undesirable since they require a complex firmware implementation and negatively affect both host performance (i.e., due to increased latency) and Quality of Service (QoS) (i.e., due to decreased available data storage space).

Aspects of the present disclosure address the above and other deficiencies by using data state metrics that are already obtained during various scans that are performed on the memory device to rate data retention capability of memory device components. More specifically, various embodiments presently disclosed use scans performed on dies of memory devices to estimate a value of a chosen data state metric that can be compared to one or more threshold values. These threshold values can each be associated with corresponding data retention capability ratings, which can, in turn, be mapped to corresponding scan frequencies for performing subsequent scan operations.

Advantages of the present disclosure include reducing the amount of resources and time that are consumed to determine the data retention capability of particular components of memory devices. Additionally, the embodiments of this disclosure increase the available data storage space on memory devices. More specifically, by leveraging the data state metric measurements obtained from scans that are already commonly performed on a continual basis in memory devices, embodiments of the present disclosure obviate the need for separate stress inducing operations to be performed to determine these metrics. Consequently, storage areas (e.g., blocks) on the memory device that would otherwise be allocated exclusively for these stress inducing operations can now be added to the pool of available storage space on the memory device (e.g., for overprovisioning used for memory management operation, or for storing host data). Accordingly, using measurements from scans that are otherwise already being performed likewise eliminates any need to perform additional scans on areas exclusively allocated for stress inducement. Therefore, additional resources become available for executing host operations on the memory device that facilitate the reduction of latency and improving QoS. Thus, as explained in more detail below, the embodiments of the present invention increase the data throughput of memory devices by eliminating potential sources of delay and increase the data storage capacity of the device by freeing up additional data storage areas.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dies and/or channels to form management units (MUs). In some embodiments, an MU can refer to a memory cell, a set of cells connected to a wordline, a page, a block, or a combination of one or more of the foregoing. An MU can refer to set of one or more individual segments of the memory device 130 that can be written or erased in a single operation. For example, memory device 130 can be divided into multiple MUs, where each MU includes one or more blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. In some embodiments, local memory 119 can include static random access memory (SRAM). While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a scan manager 113 that can perform scans on memory device 130 to obtain values of data state metrics on the memory device 130. In several embodiments, the scan manager 113 can manage the rating of dies in memory device 130, 140. In some embodiments, the memory sub-system controller 115 includes at least a portion of the scan manager 113. In some embodiments, the scan manager 113 is part of the host system 110, an application, or an operating system. In other embodiments, local media controller 135 includes at least a portion of scan manager 113 and is configured to perform the functionality described herein.

The scan manager 113 can, in some embodiments, perform various scans on data storage elements (e.g., pages) of the memory device 130. For the purposes of this disclosure, data storage elements, such as cells (e.g., connected within an array of WLs and BLs), pages, blocks, planes, dies, as well as groups and combinations of one or more of the foregoing elements, can be referred to as "data storage units". In the context of two data storage units, the data storage unit that can include or subsume the other data storage unit can be referred to as the "higher order data storage unit". Similarly, in the same context, a storage unit that can be included in or subsumed by the other data storage unit can be referred to as the "lower order data storage unit". The present disclosure emphasizes some embodiments where the higher order data storage units (i.e., $\text{Unit}_{Type1}$) are represented by dies that include respective groups of lower order data storage units (i.e., $\text{Unit}_{Type2}$) that are represented by pages (i.e., embodiments where relationships between higher order data storage units and lower order data storage units are represented by the relationships between dies and pages). In other embodiments, analogous relationships are contemplated with respect other $\text{Unit}_1$:$\text{Unit}_2$ pairs in the hierarchy (i.e., relationships between $\text{Unit}_{Type1}$:$\text{Unit}_{Type2}$ pairs such as die:plane, die:block, die:cell array, die:cell, plane:block, plane:page, plane:cell array, plane:cell, block:page, block:cell array, block:cell, page:half-page, page:cell array, page:cell, block:wordline, plane:block-and-page-combination, die:page-and-cell-array-combination, etc).

As noted, these scans can produce measurements of a variety of different data state metrics including error count, RBER, valley shift, valley width, read count, etc. For the purposes of the present disclosure, a read count can refer to the number of times the data stored in a particular location of a memory device has been accessed (i.e., read).

Thus, in some embodiments, the scan manager 113 can scan a group of pages residing on one of the dies of the memory device 130. Because data state metrics can be obtained more accurately from fully programmed blocks, in some cases, the group of pages can be selected to include pages that exclusively form fully programmed blocks on the memory device. Similarly, because measurements of data state metrics obtained from (cells coupled to) some wordlines are more indicative than those obtained from other wordlines, the group of pages can be selected to include pages that coincide with a particular set of wordlines on the memory device.

In some embodiments, the scans performed by the scan manager 113 can include scans that facilitate read voltage calibration as well as scans that check the data integrity after various read-disturb stresses. For example, the scan manager 113 can perform, on each page in the group, a scan that can be referred to as a valley health check that generates the following data state metric measurements: the valley width between two specified adjacent $V_t$ distributions; and the center of the valley (and the shift of the center from a previous measurement). In another example, the scan manager 113 can perform, on each page in the group, a scan referred to as a read disturb scan on the group of pages to obtain the following data state metric measurements: a read count for the page, and the center of the valley between two specified adjacent $V_t$ distributions (and the shift of the center from a previous measurement). As will be described in more detail with reference to FIGS. 2A-2C, the values of the metrics directly obtained by the scans performed by the scan manager 113 can reflect (i.e., through an application of a known mathematical transformation) the measure of another data state metric. For example, by performing a valley health check scan, the scan manager 113 can obtain an error count at one valley margin ($EC_1$) and an error count at another valley margin ($EC_2$) to derive the valley width which can be represented by $$\log_{10}\left(\frac{((EC_1)+(EC_2))}{2}\right).$$

Similarly, by performing a valley health scan, the scan manager 113 can obtain a current measure of a valley center to derive the valley shift by subtracting a previous measure of the valley center from the current measure of the valley center. Analogously, by performing a read disturb scan, the scan manager 113 can obtain a current measure of a read count to derive a value of a logarithm of the read count (i.e. $\log_{10}$ (Read Count) that can be matched with a corresponding valley width value.

Accordingly, in the several embodiments, while performing the scan(s), the scan manager 113 can record the measured values of the data state metrics. In some embodiments, the scan manager 113 can determine, for each page of the group of pages, a value of one data state metric and a corresponding value of another data state metric. In some example embodiments, the scan manager 113 can determine, for each page in the group, a value of a measure of a shift of a center of a valley between a pair of specified threshold voltage distributions and a value of a corresponding metric reflective of a width of a valley between a pair of specified threshold voltage distributions. This can be referred to as obtaining a valley shift value and a corresponding valley width value. In other example embodiments, the scan manager 113 can determine, for each page of the group of pages, a value of a metric reflective of a count of read operations and a value of a corresponding metric reflective of a width of a valley between a pair of specified threshold voltage distributions. This can be referred to as obtaining a read count value and a corresponding valley width value. In some embodiments, a metric reflective of a measure of the width of the valley can be a running average of the valley width.

As the scan manager 113 determines the values of the above-mentioned data state metrics, the scan manager 113 can record, for the group of pages, a set of values of one data state metric and a corresponding set of values of the other data state metric in one or more entries in a data structure (e.g., a table). Each entry in the data structure can include at least two values, a value of one data state metric and a corresponding value of the other data state metric. In some embodiments, the scan manager 113 can record, for the group of pages, a set of valley shift values and a corresponding set of valley width values in one or more entries in a data structure. In these embodiments, each entry in the data structure can include one valley shift value and one corresponding valley width value. In other embodiments, the scan manager 113 can record, for the group of pages, a set of read count values and a corresponding set of valley width values in one or more entries in a data structure. In these embodiments, each entry can include one read count value and one corresponding valley width value.

In several embodiments, a predetermined value of one of the data state metrics obtained from a scan can be associated with a failure condition of a data storage unit on the memory device 130 (i.e., a particular degree of data degradation at which a read operation performed on the data generates an error rate that exceed the ability of the scan manager 113 or memory device 130 to correct them). This predetermined value can be stored in a data structure on the memory sub-system controller 115 or on the memory device 130. For example, a known predetermined valley shift value can be associated with the failure of memory sub-system 110 to accurately retrieve (i.e., read) data from the data storage unit on memory device 130. Accordingly, the scan manager 113 can identify (e.g., in a data structure) the predetermined value of the first data state metric that is associated with a failure condition of the data storage unit on the memory device. Consequently, using the data structure, the scan manager 113 can calculate the value of the second data state metric that corresponds to a predetermined value of the first data state metric (i.e. where the predetermined value of the first data state metric is associated with a failure condition such as a failure to accurately read data on the data storage unit on the memory device). In some embodiments, a predetermined valley shift value can be associated with a failure condition of a die on the memory device. Thus, by using the data structure, the scan manager 113 can calculate the valley width value corresponding to the predetermined valley shift value. In other embodiments, a predetermined read count value can be associated with the failure condition of a die on the memory device. Thus, the scan manager 113 can calculate, using the data structure, the valley width value corresponding to that predetermined read count value. In this manner, the scan manager can obtain the calculated value of the second data state metric that can also be associated with the failure condition (e.g., the calculated valley width value that is associated with a failure to accurately read data from a particular data storage unit, such as a die, on the memory device 130).

In some embodiments, the calculated value of the second data state metric can satisfy one or more criteria (e.g., threshold criteria or criteria defined relative to one or more threshold values). For example, a criterion may be satisfied if the second data state metric exceeds a threshold value. In another example, a criterion may be satisfied if the second data state metric is both smaller than one threshold value and larger than another threshold value. Consequently, in some embodiments, the scan manager 113 can identify, in a set of criteria, a particular criterion that is satisfied by the calculated value of the second data state metric (e.g., a value of the second data state metric that can be mapped to a set of ranges of values, as described in more detail below). For example, in the set of criteria, the scan manager 113 can identify a most restrictive criterion that is satisfied by the calculated value of the second data state metric. The criterion that is most restrictive can be a criterion having the smallest likelihood of being satisfied. For example, in a set of criteria where each criterion is associated with respective threshold value, the most restrictive criterion may be the criterion that is defined as satisfied when the calculated value of the second data state metric exceeds the largest threshold value. Alternatively, for the same set of criteria, the most restrictive criterion may be the criterion that is defined as satisfied when the calculated value of the second data state metric is smaller than the smallest threshold value. In another example using the same set of criteria, the most restrictive criterion may be the criterion that is defined as satisfied when the calculated value of the second data state metric is between two threshold values. In the various embodiments, each criterion can respectively correspond to a different rating (e.g., a data retention capability rating).

Accordingly, in some embodiments, the scan manager 113 can identify, in a set of threshold valley width values, the largest threshold valley width value that is exceeded by the calculated valley width value. In the set of valley width values, each threshold valley width value can respectively correspond to a different data retention capability rating.

Consequently, the scan manager 113 can assign, to the die on which the group of scanned pages is located, the rating that corresponds to the identified particular criterion. For example, in some embodiments, the scan manager 113 can assign, to the die, the rating corresponding to the identified most restrictive criterion. In some cases, this can include assigning, to the die, the rating that corresponds to the identified largest threshold valley width value. In other cases, this can include assigning, to the die, the rating corresponding to the identified largest threshold valley width value or the rating corresponding the identified average threshold valley width value. Each rating can be associated with a different frequency of scans (i.e., with the performance of scans at a respectively different regular time intervals). In these embodiments, having assigned the rating to the die, scan manager 113 can perform subsequent scans on the die at a frequency (i.e., frequency of consecutive scans) that is determined by the assigned rating. In this manner, dies that are assigned respectively different ratings can have subsequent scans performed on them at correspondingly different regular time intervals.

In the same or other embodiments, the scan manager 113 can determine whether the calculated value of the second data state metric satisfies a threshold criterion. For example, in some embodiments, the threshold criterion can be satisfied if the calculated value exceeds a predetermined threshold value, while in other embodiments, the threshold criterion can be satisfied if the calculated value is smaller than a predetermined threshold value. For example, the scan manager 113 can determine whether the calculated valley width value exceeds a predetermined threshold valley width value. Then, if it determines that the calculated value satisfies the threshold criterion, the scan manager 113 can, assign, to the die, one rating. Alternatively, if it determines that the calculated value does not satisfy the threshold criterion, the scan manager 113 can assign a different rating to the die. Accordingly, as in the other embodiments, the scan manager 113 can then perform subsequent scans on the die at a frequency of consecutive scans that is determined by the rating assigned to the die. Implementations of the various aspects and principles of the operation of the scan manager 113 mentioned above are described in more detail below with reference to FIGS. 2A-2C. Further details with regards to these generally described operations of the scan manager 113 are explained below with reference to FIGS. 3-5.

Figure 2A:
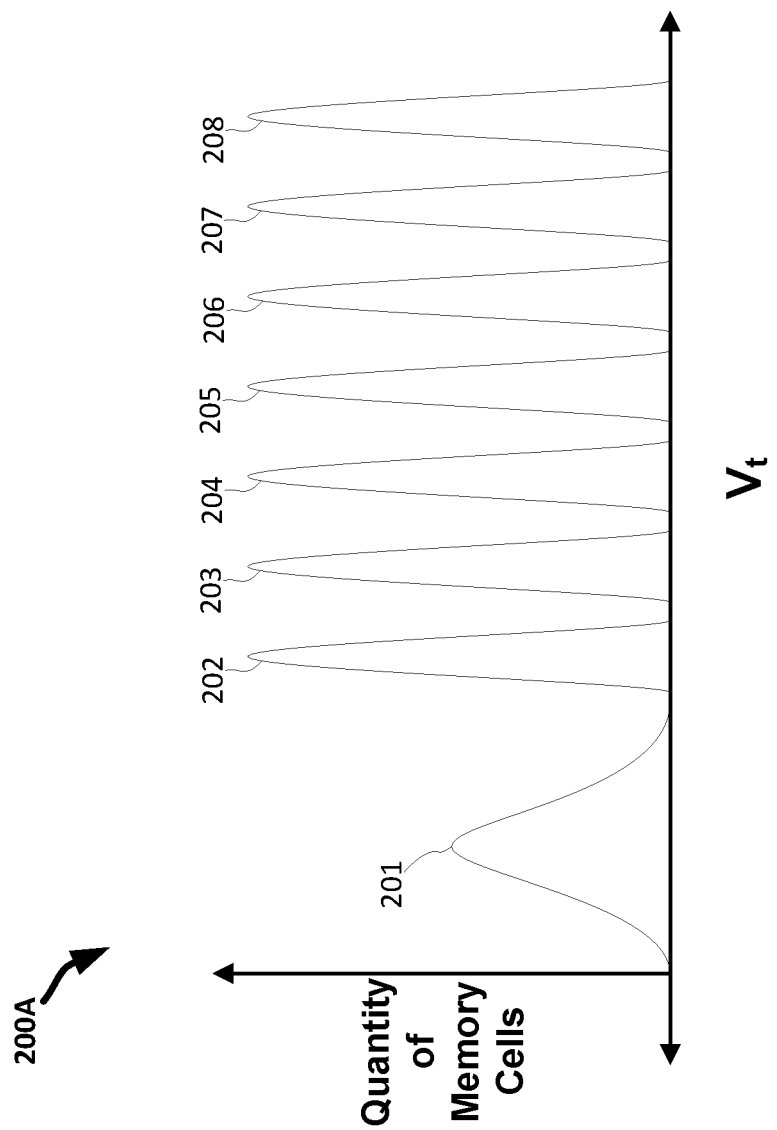
FIG. 2A is a graph of an example set of threshold voltage distributions of multiple memory cells of a memory array in a memory device in accordance with some embodiments of the present disclosure.

FIG. 2A is a graph 200A of an example set of threshold voltage distributions of multiple memory cells of a memory array in a memory device in accordance with some embodiments of the present disclosure. In some embodiments, memory cells on a block of a memory device (e.g., memory device 130 of FIG. 1) can have different Vt values an aggregate representation of which for a set of these memory cells can be shown with plots on a graph such as graph 200A. For example, a set of Vt ranges and their distributions for a group of eight level memory cells (e.g., TLC memory cells) is depicted in FIG. 2A. In some embodiments, each of these memory cells can be programmed to a Vt that is within one of eight different threshold voltage ranges 201-208. Each of the different Vt ranges can be used to represent a distinct programming state that corresponds to a particular pattern of three bits. In some embodiments, the threshold voltage range 201 can have a greater width than the remaining threshold voltage ranges 202-208. This can be caused by the memory cells initially all being placed in the programming state corresponding to the threshold voltage range 201, after which some subsets of those memory cells can be subsequently programmed to have threshold voltages in one of the threshold voltages ranges 202-208. Because write (i.e., programming) operations can be more precisely controlled than erase operations, these threshold voltage ranges 202-208 can have more narrow distributions.

In some embodiments, the threshold voltage ranges 201, 202, 203, 204, 205, 206, 207, and 208 can each represent a respective programming state (e.g., represent L0, L1, L2, L3, L4, L5, L6, and L7, respectively). For example, if the $V_t$ of a memory cell is within the first of the eight threshold voltage ranges 201, the memory cell in this case can be said to be in a programming state L0 corresponding to the memory cell storing a 3-bit logical value of '111' (this can be referred to as the erased state of the memory cell). Thus, if the threshold voltage is within the second of the eight threshold voltage ranges 202, the memory cell in this case can be said to be in a programming state L1 corresponding to the memory cell storing a 3-bit logical value '011'. If the threshold voltage is within the third of the sixteen threshold voltage ranges 203, the memory cell in this case can be storing a programming state L2 having a 3-bit logical value '001,' and so on. In some embodiments, a correspondence table such as Table 1 can provide a correspondence between the states of the memory cells and their corresponding logical values.

TABLE 1

| Programming State | Logical Programming Value |
| --- | --- |
| L0 | 111 |
| L1 | 011 |
| L2 | 001 |
| L3 | 101 |
| L4 | 100 |
| L5 | 000 |
| L6 | 010 |
| L7 | 110 |

Other associations of programming states to corresponding logical data values are envisioned. As noted above, the distributions 201-208 are separated by valleys of varying widths. Furthermore, with time and continued use, the depicted distributions and valleys can shift and change in width. The data state metric of voltage shift obtained from various scans performed by the embodiments described herein can be obtained for the seventh valley between adjacent distributions (i.e., valley between distributions 207-208) or for the first valley between adjacent distributions (i.e., valley between distributions 201-202). Accordingly, the scans described herein involve distinguishing one state of a memory cell from another and determining data state metrics associated with the depicted distributions and valleys. This relationship is further clarified by focusing on memory cell states represented by two adjacent $V_t$ distributions, as explained in more detail with reference to FIG. 2B.

Figure 2B:
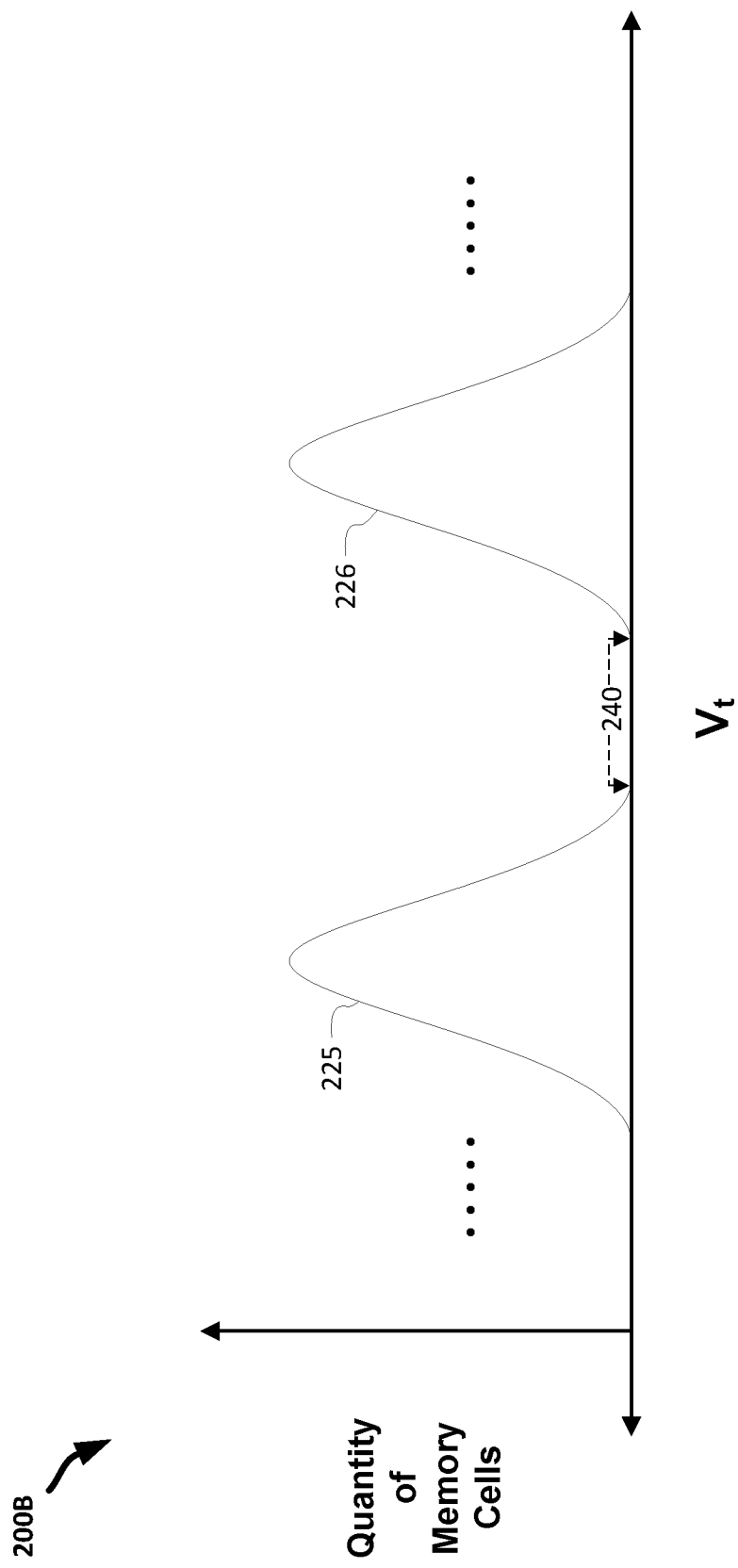
FIG. 2B is a graph of two example threshold voltage distributions of multiple memory cells of a memory array in a memory device in accordance with some embodiments of the present disclosure.

FIG. 2B is a graph 200B of two example threshold voltage distributions of multiple memory cells of a memory array in a memory device in accordance with some embodiments of the present disclosure. Consider the depiction FIG. 2B of an example $V_t$ distribution 225-226 to be analogous to a pair of adjacent $V_t$ distributions from graph 200A of FIG. 2A. For example, the $V_t$ distributions 225-226 of FIG. 2B can represent some portion of the distributions for threshold voltage ranges 201-208 of FIG. 2A after the completion of a write (i.e., programming) operation for a group of memory cells. As seen in FIG. 2B, adjacent threshold voltage distributions 225-226 can be separated by a valley with margins 240 (e.g., empty voltage level space) at the end of a programming operation. Applying a read voltage (i.e., sensing voltage) between the margins 240 to the control gates of the group of memory cells can be used to distinguish between the memory cells of the threshold voltage distribution 225 (and any lower threshold voltage distribution) and the memory cells of the threshold voltage distribution 226 (and any higher threshold voltage distribution).

Due to a phenomenon called charge loss, which can include quick charge loss (QCL) and slow charge loss (SCL), the threshold voltage of a memory cell can change over time as the electric charge contained in the cell degrades. As previously discussed, this change results in a shift of the $V_t$ distributions over time and can be referred to as a temporal $V_t$ shift (since the degrading electric charge causes the voltage distributions to shift along the voltage axis towards lower voltage levels and causes the valley defined by margins 240 to narrow over time). Further, during the operation of a memory device, the QCL can be caused by the threshold voltage changing rapidly at first (immediately after the memory cell was programmed), after which the effect of SCL becomes more evident as the $V_t$ shift slows down in an approximately logarithmic linear fashion with respect to the time elapsed since the cell was programmed. In various embodiments, this temporal $V_t$ shift, if left unadjusted, can narrow the valley width between distributions 225 and 226 (i.e., can reduce the read window between the margins 240 at the edges of the threshold voltage distributions 225-226) over time, and can cause these threshold voltage distributions 225 and 226 to overlap, making it more difficult to distinguish between cells whose actual $V_t$ is within the range of one of the two adjacent $V_t$ distributions 225-226. Accordingly, failure to mitigate the temporal $V_t$ shift (e.g., caused by the SLC and QLC) can result in the increased bit error rate in read operations. The numbers of distributions, programming levels, and logical values in the illustrative examples of FIGS. 2A-2B are chosen for illustrative purposes and are not to be interpreted as limiting, other embodiments can use various other numbers of distributions, associated programming levels, and corresponding logical values can be used in the various embodiments disclosed herein.

Figure 2C:
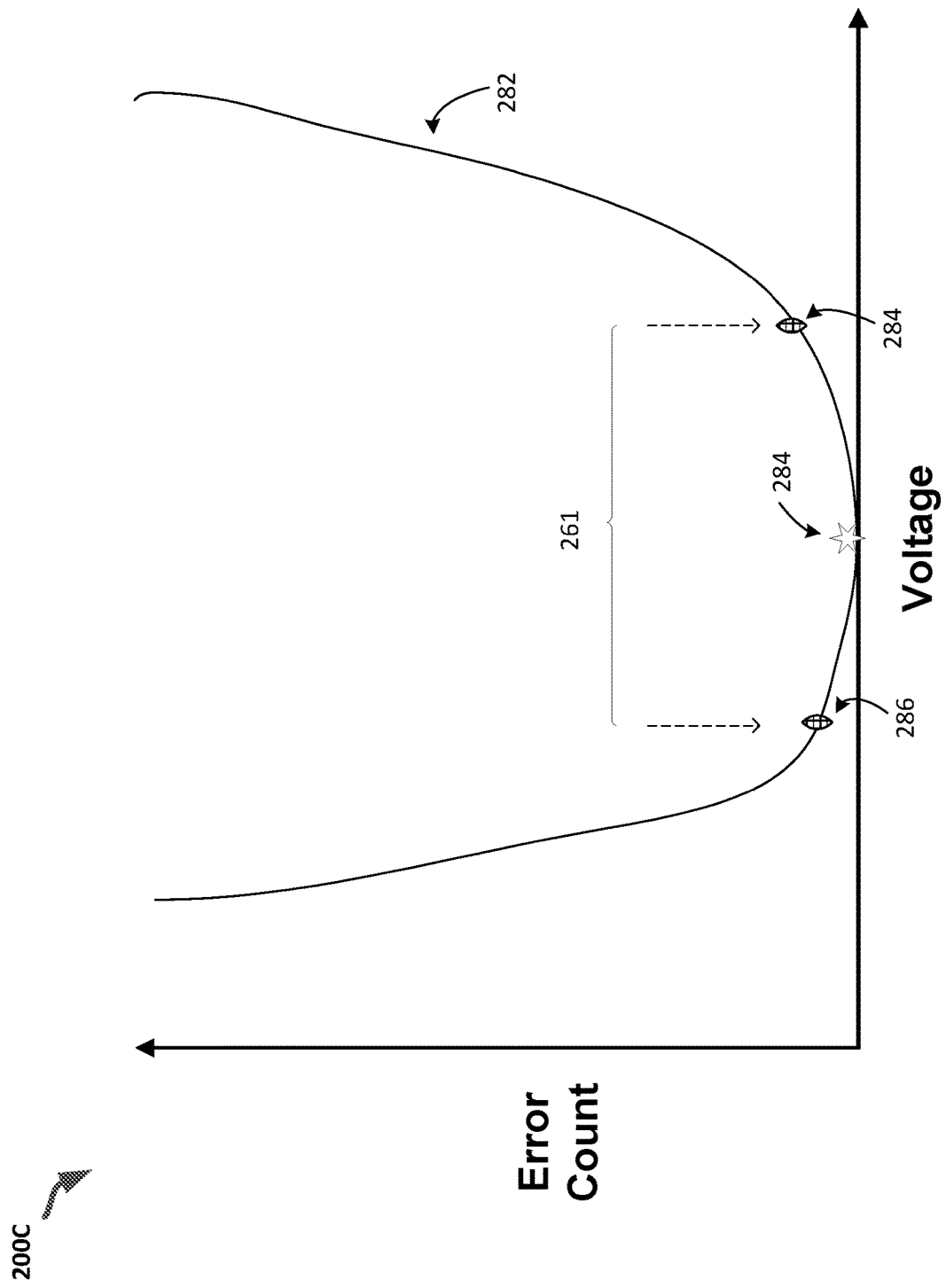
FIG. 2C is a graph of an error count as a function of an applied read voltage, in accordance with some embodiments of the present disclosure.

FIG. 2C depicts a graph 200C of an error count as a function of an applied read voltage, in accordance with some embodiments of the present disclosure. The error count can be expressed in terms of an absolute total count or a count of errors that occurs within a specified time period (i.e., an error rate). The voltage can be expressed in mV.

Thus, the plot 282 approximately represents an error count resulting from the application of specified read voltage levels for a group of memory cells. While the plot 282 does not represent a threshold voltage distribution or valley, the points along plot 282 can be correlate with points along a distribution curve (e.g., distributions 201-208 of FIG. 2A or distributions 225-226 of FIG. 2B). Accordingly, the plot 282 can be related to data state metrics related to a valley between two adjacent distributions, each distributions representing a different programming state of a cell.

In some embodiments, plot 282 can be generated using metric values obtained during a valley health check scan. For example, a point along the plot 282 having the lowest error count can correspond to a read voltage that best distinguished between two adjacent threshold voltage distributions. This lowest error count can be referred to as a center error count ($EC_0$) since it should occur at the center of the valley between two distributions. The $EC_0$ can be estimated by applying a series of voltages and checking the corresponding error count until the voltage corresponding to lowest error count is identified. Alternatively, the $EC_0$ can be estimated by taking half the sum of the error counts 286 at one valley margin ($EC_1$) and the error counts 284 at another valley margin ($EC_2$). In some embodiments, the valley width 261 can be inversely related to (i.e., be an inverse fraction of) the logarithm of $EC_0$, which can be represented by $$\log_{10}\left(\frac{((EC_1) + (EC_2))}{2}\right).$$

In the various embodiments described, the shift in threshold voltage (i.e., the valley shift value) can be determined by comparing the $EC_0$ measured at a particular time and the $EC_0$ measured at subsequent time.

Figure 3:
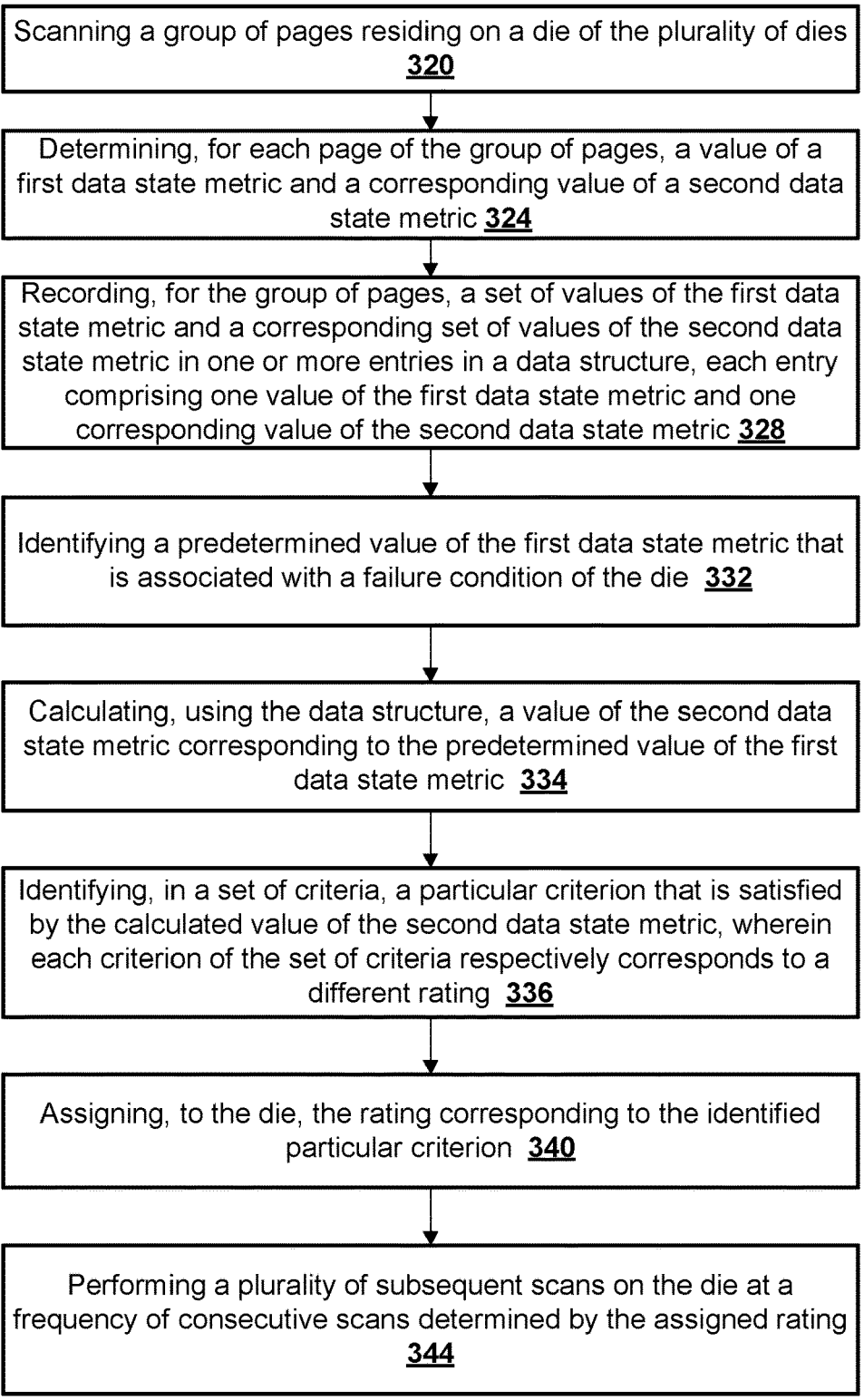
FIG. 3 is flow diagram of an example method for managing the rating of dies in memory devices in accordance with some embodiments of the present disclosure.

FIG. 3 is a flow diagram of an example method 300 example method for managing the rating of dies on memory devices in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the scan manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. In some embodiments of the present disclosure, one type of data storage unit (e.g., a page) can reside on another type of data storage unit (e.g., a die) of a memory device (e.g., the memory device 130 of FIG. 1), such that, relative to the latter data storage unit, the former is a lower order data storage unit, and, relative to the former data storage unit, the latter is a higher order data storage unit. Accordingly, although, in some embodiments, the method 300 is described by reference to planes and dies of a memory device, the method 300 can similarly be described by reference to other data storage units, where other lower order data storage units (i.e., $Unit_{Type2}$) can be substituted for planes and other higher order data storage units (i.e., $Unit_{Type1}$) can be substituted for dies wherever they appear in the description. For the sake of brevity and legibility, the present disclosure does not explicitly recite each and every variation and permutation of the described $Unit_{Type1}$:$Unit_{Type2}$ pairs. However, the present disclosure is to be interpreted as explicitly disclosing all such variations and permutations. For example, the method 300 described in terms of a page:die data storage unit pair can be embodied by other $Unit_{Type1}$:$Unit_{Type2}$ pairs such as die:plane, die:block, die:cell array, die:cell, plane:block, plane:page, plane:cell array, plane:cell, block:page, block:cell array, block:cell, page:half-page, page:cell array, page:cell, block:wordline, plane:block-and-page-combination, die:page-and-cell-array-combination, etc. Additionally, one or more processes can be omitted in various embodiments. Thus, not all processes are required in every embodiment. Other process flows are possible.

In some embodiments of the present disclosure, at operation 320, the processing logic can scan a group of pages residing on one of the dies of a memory device (e.g., the memory device 130 of FIG. 1). While scanning at operation 320, the processing logic can, at operation 324, determine, for each page of the group of pages that is scanned, a value of one data state metric and a corresponding value of another data state metric.

In the same or other embodiments, at operation 328, the processing logic can record, for the group of pages, a set of values of a data state metric and a corresponding set of values of another data state metric in one or more entries in a data structure. In some embodiments, the data structure can be a table, and each entry in the data structure can include two values, one value of one data state metric and one corresponding value of the other data state metric. In these embodiments, a predetermined value of the first data state metric can be associated with a failure condition of a data storage unit (e.g., a die) of the memory device. As previously noted, this predetermined value can be stored in a data structure (e.g., on the memory sub-system controller 115 or on the memory device 130 of FIG. 1), in which, at operation 332, the processing logic, can, identify, the predetermined value of the first data state metric that is associated with a failure condition of the data storage unit on the memory device. Consequently, at operation 334, the processing logic can calculate, using the data structure, a value of the second data state metric corresponding to a predetermined value of the first data state metric.

At operation 336, the processing logic can identify, in a set of criteria (e.g., a set where each criterion of the set of criteria respectively corresponds to a different rating), a particular criterion that is satisfied by the calculated value of the second data state metric. For example, the processing logic, at operation 336, can identify in the set, a most restrictive criterion that is satisfied by the calculated value of the second data state metric. Subsequently, at operation 340, the processing logic can assign to the die containing the group of pages, the rating corresponding to the identified particular criterion. In some cases, this can include the processing assigning, to the die, the rating that corresponds to the identified most restrictive criterion. Consequently, in some embodiments, at operation 344, the processing logic can perform multiple subsequent scans on the die at a frequency (e.g., rate of consecutive scans) that is determined by the assigned rating.

In an alternative embodiment, the processing logic can determine, at operation 336, whether the calculated value of the second data state metric satisfies a threshold criterion. For example, in some embodiments, the threshold criterion can be satisfied if the calculated value exceeds a predetermined threshold value, while in other embodiments, the threshold criterion can be satisfied if the calculated value is smaller than a predetermined threshold value. For example, the processing logic can determine whether the calculated valley width value exceeds a predetermined threshold valley width value. Then, if it determines that the calculated value satisfies the threshold criterion, at operation 340 the processing logic can, assign, to the die, one rating. Alternatively, if it determines that the calculated value does not satisfy the threshold criterion, at operation 340 the processing logic can assign a different rating to the die. Accordingly, as in the other embodiments, the processing logic can then, at operation 344, perform subsequent scans on the die at a frequency of consecutive scans that is determined by the rating assigned to the die. Additional details of managing the rating of dies on memory devices are provided below with reference to FIG. 4.

Figure 4:
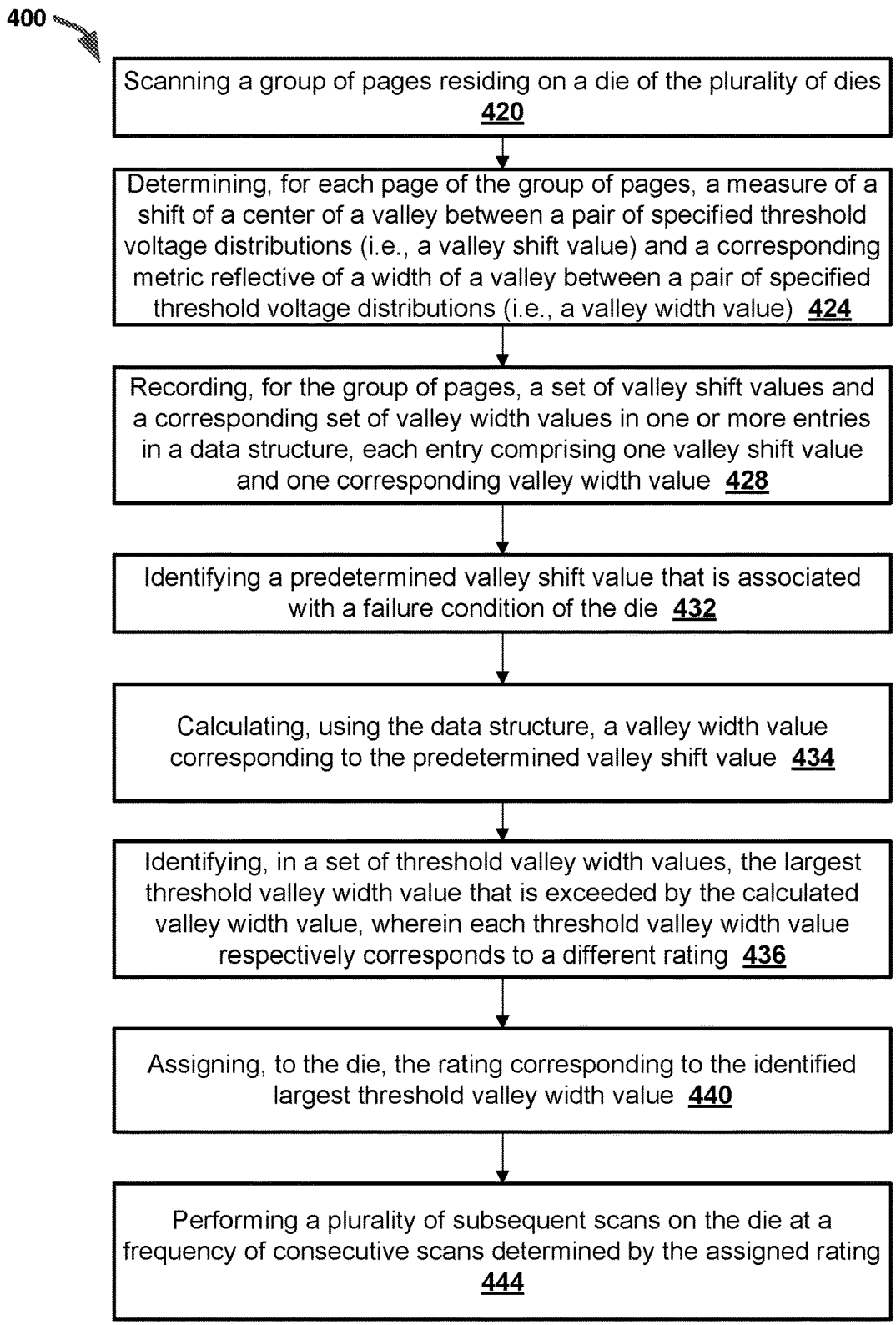
FIG. 4 is a flow diagram of an example method for managing the rating of dies in memory devices in accordance with some embodiments of the present disclosure.

FIG. 4 is flow diagram of an example method 400 example method for managing the rating of dies on memory devices in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the scan manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. In some embodiments of the present disclosure, one type of data storage unit (e.g., a page) can reside on another type of data storage unit (e.g., a die) of a memory device (e.g., the memory device 130 of FIG. 1), such that, relative to the latter data storage unit, the former is a lower order data storage unit, and, relative to the former data storage unit, the latter is a higher order data storage unit. Accordingly, although, in some embodiments, the method 400 is described by reference to planes and dies of a memory device, the method 400 can similarly be described by reference to other data storage units, where other lower order data storage units (i.e., $Unit_{Type2}$) can be substituted for planes and other higher order data storage units (i.e., $Unit_{Type1}$) can be substituted for dies wherever they appear in the description. For the sake of brevity and legibility, the present disclosure does not explicitly recite each and every variation and permutation of the described $Unit_{Type1}$: $Unit_{Type2}$ pairs. However, the present disclosure is to be interpreted as explicitly disclosing all such variations and permutations. For example, the method 400 described in terms of a page:die data storage unit pair can be embodied by other $Unit_{Type1}$:$Unit_{Type2}$ pairs such as die:plane, die: block, die:cell array, die:cell, plane:block, plane:page, plane: cell array, plane:cell, block:page, block:cell array, block: cell, page:half-page, page:cell array, page:cell, block: wordline, plane:block-and-page-combination, die:page-and-cell-array-combination, etc. Additionally, one or more processes can be omitted in various embodiments. Thus, not all processes are required in every embodiment. Other process flows are possible.

In several embodiments described herein, operations of example method 400 can be performed together with or instead of operations of example method 300. In some embodiments of the present disclosure, at operation 420, the processing logic can scan a group of pages residing on one of the dies of a memory device (e.g., the memory device 130 of FIG. 1). While scanning at operation 420, the processing logic can, at operation 424, determine, for each page of the group of pages, a value of a measure of a shift of a center of a valley (i.e., a valley shift value) between a pair of specified threshold voltage distributions (e.g., valley between distributions 207-208 or valley between distributions 201-202 of FIG. 2A or valley between distributions 225-226 of FIG. 2B) and a value of a corresponding metric reflective of a width of the same valley (i.e., a corresponding valley width value) between the same pair of specified threshold voltage distributions.

In the same or other embodiments, at operation 428, the processing logic can record, for the group of pages, a set of valley shift values and a corresponding set of valley width values in one or more entries in a data structure, where each entry includes one valley shift value and one corresponding valley width value. In these embodiments, a predetermined valley shift value can be associated with a failure condition of a die on the memory device. As previously noted, this predetermined valley shift value can be stored in the same or different data structure (e.g., on the memory sub-system controller 115 or on the memory device 130 of FIG. 1), in which, at operation 432, the processing logic, can, identify, the predetermined valley shift value that is associated with a failure condition of a die on the memory device. Consequently, at operation 434, the processing logic can calculate, using the data structure, a valley width value corresponding to a predetermined valley shift value (i.e., the predetermined valley shift value that is associated with the failure condition of the die on the memory device as described earlier).

At operation 436, the processing logic can identify, in a set of threshold valley width values (e.g., a set where each threshold valley width value respectively corresponds to a different rating), the largest threshold valley width value that is exceeded by the calculated valley width value. Subsequently, at operation 440, the processing logic can assign, to the die, the rating corresponding to the identified largest threshold valley width value. In some embodiments, the processing logic can then, at operation 444, perform multiple subsequent scans on the die at a frequency (e.g., rate of consecutive scans) that is determined by the assigned rating. Additional details regarding managing the rating of dies are explained below with reference to FIG. 5.

Figure 5:
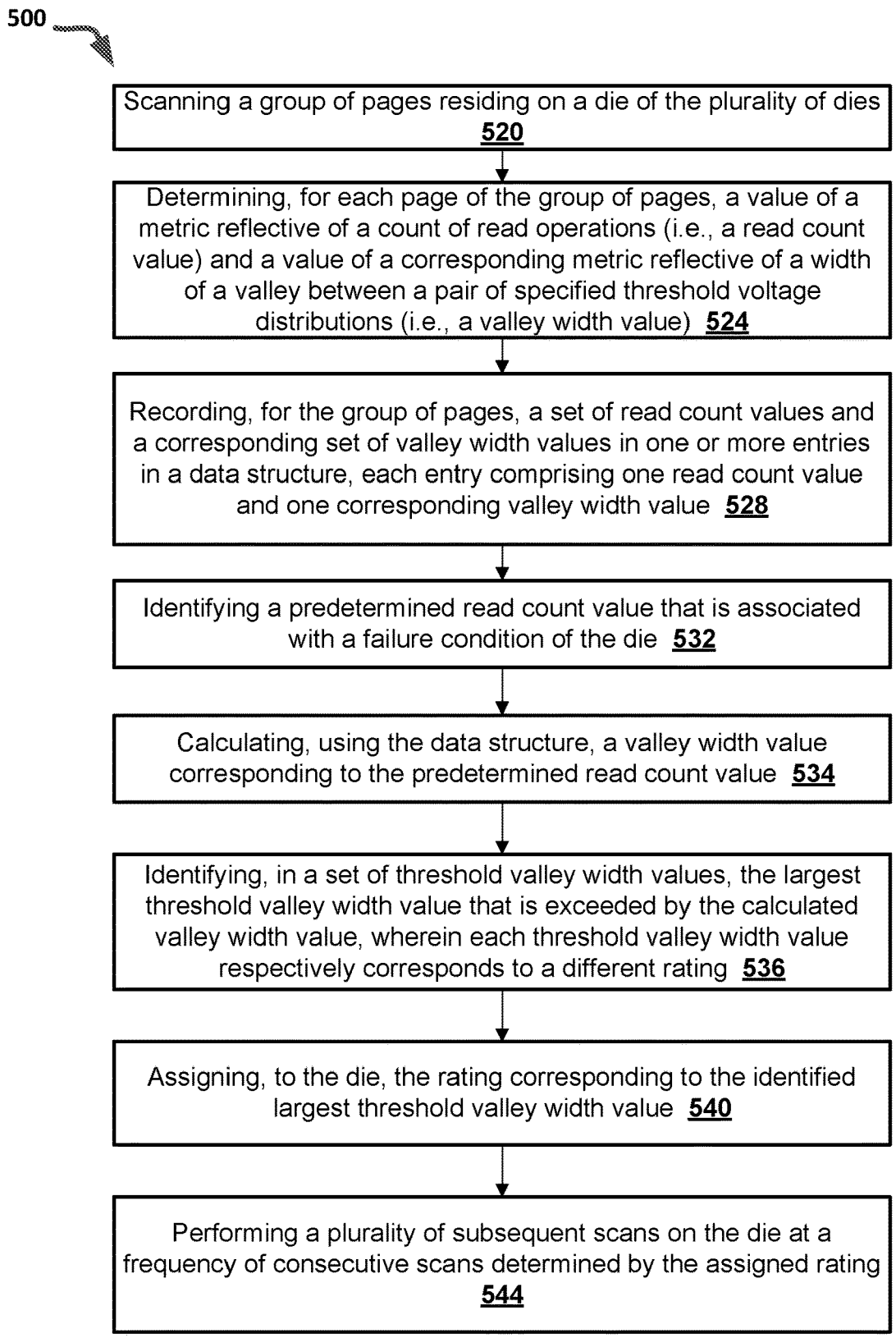
FIG. 5 is a flow diagram of an example method for managing the rating of dies in memory devices in accordance with some embodiments of the present disclosure.

FIG. 5 is flow diagram of an example method 500 for example method for managing the rating of dies in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the scan manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. In some embodiments of the present disclosure, one type of data storage unit (e.g., a page) can reside on another type of data storage unit (e.g., a die) of a memory device (e.g., the memory device 130 of FIG. 1), such that, relative to the latter data storage unit, the former is a lower order data storage unit, and, relative to the former data storage unit, the latter is a higher order data storage unit. Accordingly, although, in some embodiments, the method 500 is described by reference to planes and dies of a memory device, the method 500 can similarly be described by reference to other data storage units, where other lower order data storage units (i.e., $\text{Unit}_{Type2}$) can be substituted for planes and other higher order data storage units (i.e., $\text{Unit}_{Type1}$) can be substituted for dies wherever they appear in the description. For the sake of brevity and legibility, the present disclosure does not explicitly recite each and every variation and permutation of the described $\text{Unit}_{Type1}$:$\text{Unit}_{Type2}$ pairs. However, the present disclosure is to be interpreted as explicitly disclosing all such variations and permutations. For example, the method 500 described in terms of a page:die data storage unit pair can be embodied by other $\text{Unit}_{Type1}$:$\text{Unit}_{Type2}$ pairs such as die:plane, die:block, die:cell array, die:cell, plane:block, plane:page, plane:cell array, plane:cell, block:page, block:cell array, block:cell, page:half-page, page:cell array, page:cell, block:wordline, plane:block-and-page-combination, die:page-and-cell-array-combination, etc. Additionally, one or more processes can be omitted in various embodiments. Thus, not all processes are required in every embodiment. Other process flows are possible.

In several embodiments described herein, operations of example method 500 can be performed together with or instead of operations of example method 400. In some embodiments of the present disclosure, at operation 520, the processing logic can scan a group of pages residing on one of the dies of a memory device (e.g., the memory device 130 of FIG. 1). While scanning at operation 520, the processing logic can, at operation 524, determine, for each page of the group of pages, a value of a metric reflective of a count of read operations (i.e., a read count value) and a value of a corresponding metric reflective of a width of a valley (i.e., a valley width value) between a pair of specified threshold voltage distributions (e.g., valley between distributions 207-208 or valley between distributions 201-202 of FIG. 2A or valley between distributions 225-226 of FIG. 2B).

In the same or other embodiments, at operation 528, the processing logic can record, for the group of pages, a set read count values and a corresponding set of valley width values in one or more entries in a data structure, where each entry includes one read count value and one corresponding valley width value. In these embodiments, a predetermined read count value can be associated with a failure condition of a die on the memory device. As previously noted, this predetermined read count value can be stored in the same or different data structure (e.g., on the memory sub-system controller 115 or on the memory device 130 of FIG. 1), in which, at operation 532, the processing logic, can, identify the predetermined read count value that is associated with a failure condition for of a die on the memory device. Consequently, at operation 534, the processing logic can calculate, using the data structure, a valley width value corresponding to the predetermined read count value (i.e., the predetermined read count value that is associated with a failure condition of the die on the memory device as described earlier).

At operation 536, the processing logic can identify, in a set of threshold valley width values (e.g., a set where each threshold valley width value respectively corresponds to a different rating), the largest threshold valley width value that is exceeded by the calculated valley width value. Subsequently, at operation 540, the processing logic can assign, to the die, the rating corresponding to the identified largest threshold valley width value. In some embodiments, the processing logic can then, at operation 544, perform multiple subsequent scans on the die at a frequency (e.g., rate of consecutive scans) that is determined by the assigned rating.

Figure 6:
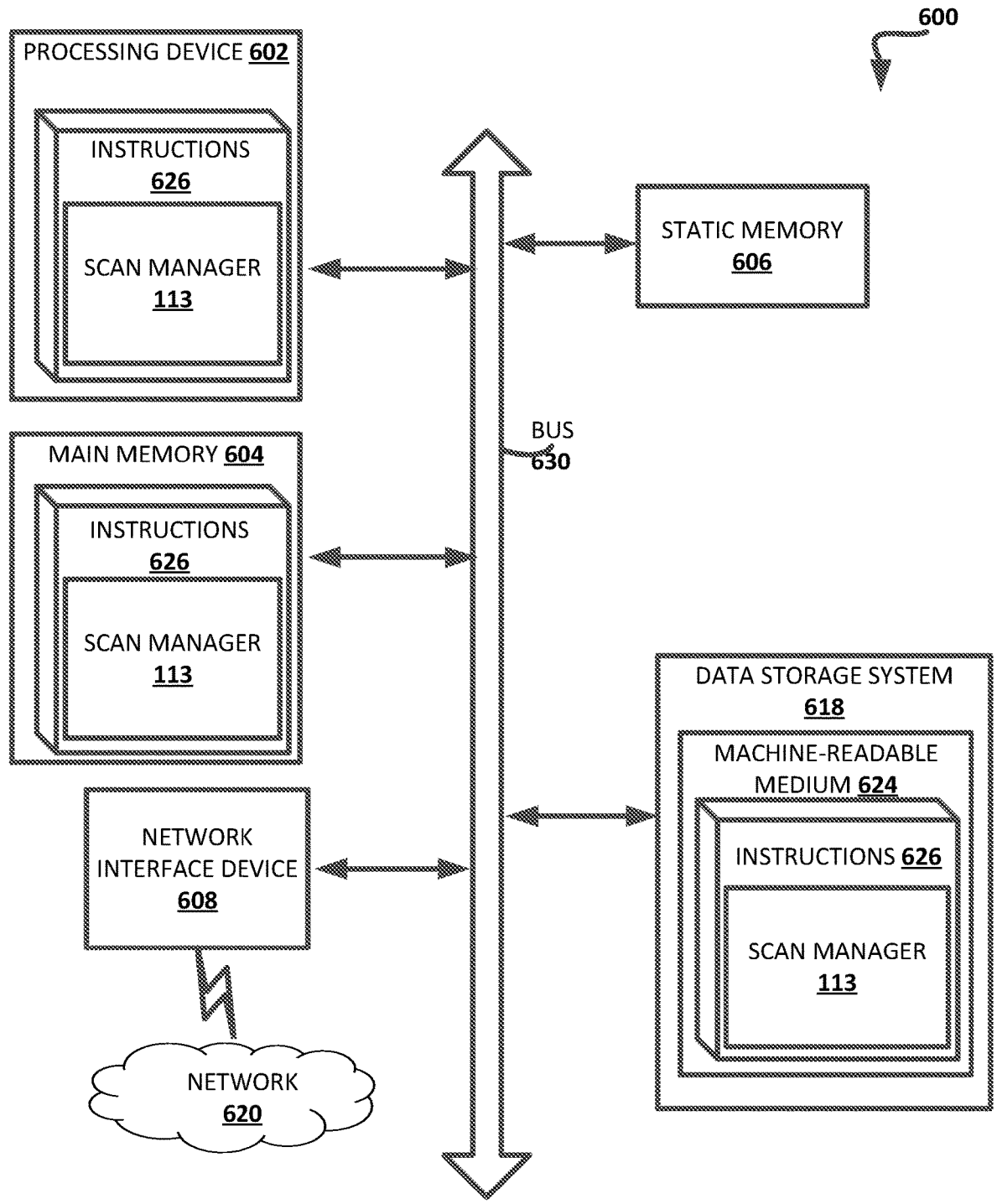
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the scan manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a scan manager (e.g., the scan manager 113 of FIG. 1 and the methods 300, 400, and 500 of FIGS. 3, 4, and 5 respectively). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of dies, each die comprising a corresponding array of memory cells arranged in a plurality of pages; and
a processing device, operatively coupled with the memory device, to perform operations comprising:
scanning a group of pages residing on a die of the plurality of dies;
determining, for each page of the group of pages, a value of a first data state metric and a corresponding value of a second data state metric;
recording, for the group of pages, a set of values of the first data state metric and a corresponding set of values of the second data state metric in one or more entries in a data structure, each entry comprising one value of the first data state metric and one corresponding value of the second data state metric;
identifying a predetermined value of the first data state metric that is associated with a failure condition of the die;
calculating, using the data structure, the value of the second data state metric corresponding to the predetermined value of the first data state metric;
identifying, in a set of criteria, a particular criterion that is satisfied by the calculated value of the second data state metric, wherein each criterion of the set of criteria respectively corresponds to a different rating;
assigning, to the die, the rating corresponding to the identified particular criterion; and
performing a plurality of subsequent scans on the die at a frequency of consecutive scans determined by the assigned rating.

2. The system of claim 1, wherein the first data state metric is a measure of a shift of a center of a valley between a pair of specified threshold voltage distributions.

3. The system of claim 1, wherein the first data state metric is reflective of a count of read operations.

4. The system of claim 1, wherein the second data state metric is reflective of a width of a valley between a pair of specified threshold voltage distributions.

5. The system of claim 1, wherein the failure condition of the die is a degree of data degradation at which a read operation performed on data stored on the die generates a specified error rate.

6. The system of claim 1, wherein determining whether the calculated value of the second data state metric satisfies the set of criteria comprises determining whether the calculated value of the second data state metric is greater than one or more threshold values.

7. The system of claim 1, wherein each rating has a different corresponding frequency of consecutive scans to be performed on the die.

8. A method comprising:
scanning a group of first data storage units residing on a second data storage unit of a plurality of second data storage units of a memory device;
determining, for each first data storage unit of the group of first data storage units, a value of a first data state metric and a corresponding value of a second data state metric;
recording, for the group of first data storage units, a set of values of the first data state metric and a corresponding set of values of the second data state metric in one or more entries in a data structure, each entry comprising one value of the first data state metric and one corresponding value of the second data state metric;
identifying a predetermined value of the first data state metric that is associated with a failure condition of the second data storage unit;
calculating, using the data structure, the value of the second data state metric corresponding to the predetermined value of the first data state metric;
identifying, in a set of criteria, a particular criterion that is satisfied by the calculated value of the second data state metric, wherein each criterion of the set of criteria respectively corresponds to a different rating;
assigning, to the second data storage unit, the rating corresponding to the identified particular criterion; and
performing a plurality of subsequent scans on the second data storage unit at a frequency of consecutive scans determined by the assigned rating.

9. The method of claim 8, wherein the first data state metric is a measure of a shift of a center of a valley between a pair of specified threshold voltage distributions.

10. The method of claim 8, wherein the first data state metric is reflective of a count of read operations.

11. The method of claim 8, wherein the second data state metric is reflective of a width of a valley between a pair of specified threshold voltage distributions.

12. The method of claim 8, wherein the failure condition of the second data storage unit is a degree of data degradation at which a read operation performed on data stored on the die generates a specified error rate.

13. The method of claim 8, wherein determining whether the calculated value of the second data state metric satisfies the set of criteria comprises determining whether the calculated value of the second data state metric is greater than one or more threshold values.

14. The method of claim 8, wherein each rating has a different corresponding frequency of consecutive scans to be performed on the second data storage unit.

15. A non-transitory computer-readable storage medium comprising instructions that, when executed by a processing device, cause the processing device to perform operations comprising:
scanning a group of pages residing on a die of a plurality of dies of a memory device;
determining, for each page of the group of pages, a value of a first data state metric and a corresponding value of a second data state metric;
recording, for the group of pages, a set of values of the first data state metric and a corresponding set of values of the second data state metric in one or more entries in a table, each entry comprising one value of the first data state metric and one corresponding value of the second data state metric;
calculating, using the table, the value of the second data state metric corresponding to a predetermined value of the first data state metric, wherein the predetermined value of the first data state metric is associated with a specified read error rate;
determining whether the calculated value of the second data state metric satisfies a threshold criterion;
responsive to determining that the calculated value satisfies the threshold criterion, assigning, to the die, a first rating;
responsive to determining that the calculated value does not satisfy the threshold criterion, assigning, to the die, a second rating; and
performing a plurality of subsequent scans on the die at a frequency of consecutive scans determined by the rating assigned to the die.

16. The non-transitory computer-readable storage medium of claim 15, wherein the first data state metric is a measure of a shift of a center of a valley between a pair of specified threshold voltage distributions.

17. The non-transitory computer-readable storage medium of claim 15, wherein the first data state metric is reflective of a count of read operations.

18. The non-transitory computer-readable storage medium of claim 15, wherein the second data state metric is reflective of a width of a valley between a pair of specified threshold voltage distributions.

19. The non-transitory computer-readable storage medium of claim 15, wherein the second data state metric is an inverse fraction of a measure of a shift of a center of a valley between a pair of specified threshold voltage distributions.

20. The non-transitory computer-readable storage medium of claim 15, wherein each rating has a different corresponding frequency of consecutive scans to be performed on the die.

* * * * *